United States Patent [19]
Contiero et al.

[11] Patent Number: 5,081,517
[45] Date of Patent: Jan. 14, 1992

[54] MIXED TECHNOLOGY INTEGRATED CIRCUIT COMPRISING CMOS STRUCTURES AND EFFICIENT LATERAL BIPOLAR TRANSISTORS WITH A HIGH EARLY VOLTAGE AND FABRICATION THEREOF

[75] Inventors: Claudio Contiero, Buccinasco; Paola Galbiati, Monza; Lucia Zullino, Milan, all of Italy

[73] Assignee: SGS-Thomson Microelectronics S.R.L., Italy

[21] Appl. No.: 548,711

[22] Filed: Jul. 6, 1990

[51] Int. Cl.$^5$ ............................................. H01L 27/02
[52] U.S. Cl. ........................................ 357/43; 357/34; 357/42; 357/48; 357/52
[58] Field of Search ................... 357/34, 42, 43, 48, 357/52

[56] References Cited
U.S. PATENT DOCUMENTS
4,812,891 3/1989 Bingham .......................... 357/36

Primary Examiner—Edward J. Wojciechowiczs
Attorney, Agent, or Firm—Pollock, Vande Sande & Priddy

[57] ABSTRACT

A high density, mixed technology integrated circuit comprises CMOS structures and bipolar lateral transistors, the electrical efficiency and Early voltage of which are maintained high by forming "well" regions through the collector area. The operation determines the formation of a "collector extension region" extending relatively deep within the epitaxial layer so as to intercept the emitter current and gather it to the collector, subtracting it from dispersion toward the substrate through the adjacent isolation junctions surrounding the region of the lateral bipolar transistor. Under comparable conditions, the ratio between Ic Isubstrate is incremented from about 8 to about 300 and the Early voltage from about 20V to about 100V. The $V_{CEO}$, $BV_{CBO}$ and $BV_{CES}$ voltages are also advantageously increased by the presence of said "well" region formed in the collector zone.

3 Claims, 2 Drawing Sheets

MIXED TECHNOLOGY INTEGRATED CIRCUIT COMPRISING CMOS STRUCTURES AND EFFICIENT LATERAL BIPOLAR TRANSISTORS WITH A HIGH EARLY VOLTAGE AND FABRICATION THEREOF

BACKGROUND OF THE INVENTION

1. Field of the Invention

The present invention relates to a mixed technology integrated circuit wherein high density CMOS structures and lateral bipolar transistors having high Early voltage and electrical efficiency are integrated.

2. Description of the prior art

Mixed technology integrated circuits are finding growing opportunities of utilization because of their exceptional versatility. On the other hand the request for an ever increasing density of these integrated devices in order to increase miniaturization of the systems emphasizes compatibility problems in forming different technology structures such as bipolar transistors and MOS (CMOS) transistors monolithically integrated in the same chip.

In particular, the realization of high density, mixed technology integrated circuits necessarily implies, according to the most modern fabrication processes, a drastic reduction of the junction depth of diffusions. This fact, while bringing important advantages in making effective CMOS structures, tends to penalize electrical efficiency and Early voltage characteristics of lateral bipolar transistors. In fact in first-generation, mixed technology integrated circuits wherein the isolation field oxide was geometrically defined after its formation and wherein the junction depth remained relatively large (e.g. from 3 to 4 pm for p+ diffusions), the efficiency of lateral bipolar transistors remained satisfactory, but the structures could not be made very dense. Vice versa in mixed technology integrated circuits made in accordance with the most modern techniques, which contemplate the growth of the isolation field oxide on areas pre-defined by means of a silicon nitride mask and the formation in a self-alignment mode of superficially enriched well regions, a high density of the integrated structures may be obtained, though accompanied by a consistent drop of electrical efficiency of lateral bipolar transistors because of a dramatically increased loss of collector current toward the isolation junctions (and the substrate) which surround the transistor region.

This mechanism is schematically depicted in FIGS. 1 and 2, wherein a partial schematic cross section of a first generation, mixed technology integrated device and of a similar integrated device made in accordance with the most modern techniques are respectively depicted. Symbols and polarities of the different regions and diffusions are customary and immediately comprehended by a skilled technician without requiring a redundant detailed description thereof.

As indicatively shown by the arrows departing from the emitter junction of the bipolar transistor (PNP in the shown example) and which identify the current lines, in the case of the low density of integration device of FIG. 1, the major portion of the emitter current is effectively gathered by the transistor's collector. On the contrary in a high density integrated device made according to modern techniques, as depicted in FIG. 2 disregarding the accuracy of a scale representation between the two figures, wherein the collector junction depth is typically only 0.7 μm, a consistent portion of the emitter current is lost to ground through the p-silicon substrate of the integrated device, being gathered by the p-type isolation junction of the transistor.

In this kind of devices, the ratio between the collector current and the current lost through the isolation junction: Ic/Isubstrate, is evaluated to be about 8, while the Early voltage presented by the lateral PNP transistor is only about 20 V.

This drop of electrical efficiency of lateral bipolar transistors cannot be avoided because in order to increase the integration density especially of CMOS structures it is necessary to reduce the lithographic dimensions, the junction depths and to employ a field oxide formed so as to permit the formation in a self-alignment mode of the superficial enrichment regions of the well (p-well in the case shown in FIG. 2) which are necessary for preventing undesired superficial inversions (creation of parasitic MOS transistors) and these restraints determine the above discussed problem in lateral bipolar transistors. In fact for countering the loss of current toward the substrate, the collector is made as close as possible to the emitter causing in turn a low Early voltage.

OBJECTIVES AND SUMMARY OF THE INVENTION

Vis-à-vis this state of the art, the present invention has as an objective the provision of high density, mixed technology integrated circuits wherein lateral bipolar transistors maintain a high electrical efficiency and a high Early voltage.

It is a further objective of the invention to provide a method for fabricating such an improved high density, mixed technology integrated circuit.

According to the present invention, through the collector area of a lateral bipolar transistor, the electrical efficiency and Early voltage of which must be desirably increased, a "well" diffusion (of the same polarity of the collector junction diffusion) is formed, which extends beyond the diffusion profile of the collector junction, deep within the epitaxial layer in order to intercept the current lines departing from the emitter junction and to gather such a current to the collector thus subtracting it from dispersion toward adjacent isolation diffusions which surround the transistor region.

The different aspects and advantages of the invention will be more easily recognized through the following detailed description of a preferred embodiment thereof having purely illustrative and not limitative purposes.

DESCRIPTION OF THE PREFERRED EMBODIMENT OF THE INVENTION

Figure 3:
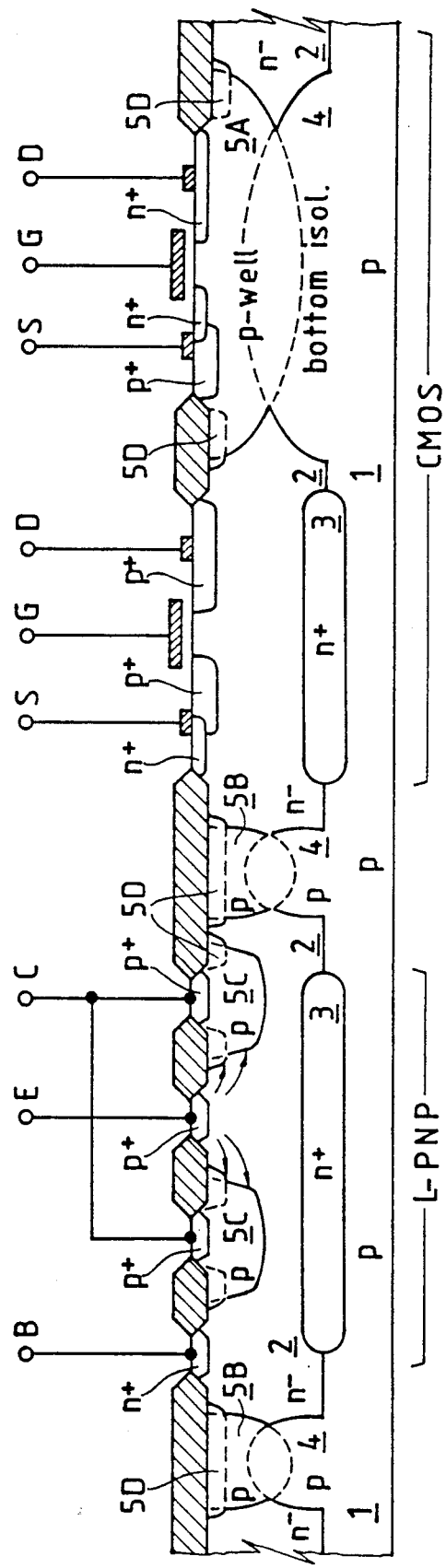
FIG. 3 is a partial schematic cross section view of a high density, mixed technology integrated circuit made in accordance with the instant invention.

As schematically shown in FIG. 3, the high density, mixed technology integrated circuit of the invention comprises, according to a preferred embodiment thereof, a monocrystalline p-type silicon substrate 1, doped with boron and having a bulk resistivity comprised between 10 and 20 ohms×cm, on which a low conductivity n⁻ epitaxial layer 2 is grown. The n+ buried layers 3 and the bottom isolation p-type diffusions 4 are made in accordance with normal fabrication techniques of this type of integrated devices. According to the same known techniques of fabrication, predefined areas of the surface of the epitaxial layer 2 are implanted with boron for forming, through a subsequent diffusion of the boron, the p- w e l l regions 5A which are used as body regions within which n-channel transistors of the CMOS structures are formed and eventually as base regions of NPN type lateral bipolar transistors (not depicted in the figure) and further used as top isolation diffusions 5B which merge with the corresponding bottom isolation diffusions 4 to form isolation walls of p-type silicon around the active areas of different devices.

According to the present invention, the same diffusion profile of the p-well 5A of the n-channel MOS transistors and of the top isolations 5B is utilized for forming a more efficient collector's deep junction (a collector extension region) of the lateral PNP transistor (region 5C), as evidenced in the figure by means of a thick line, without introducing additional process steps.

Optionally, superficial dopant enriched regions 5D (also known as channel stopper regions) may be advantageously formed at the top of said p-type regions 5A, 5B and 5C.

Commonly these "well" regions 5A, 5B and therefore also such a region in the epitaxial layer for a depth of about 4-6 μm and, in the case of the lateral PNP transistor shown, the region 5C offers an effective barrier to the dispersion of the current (represented by the arrows) toward the adjacent isolation diffusions 5B and 4. The effect of the 5C region formed in the collector zone which surrounds the emitter zone of the transistor may be easily illustrated graphically by comparing the high density structure of the invention depicted in FIG. 3 with a comparable high density structure shown in FIG. 2 made in accordance with the prior art and not having such a 5C region.

Figure 1:
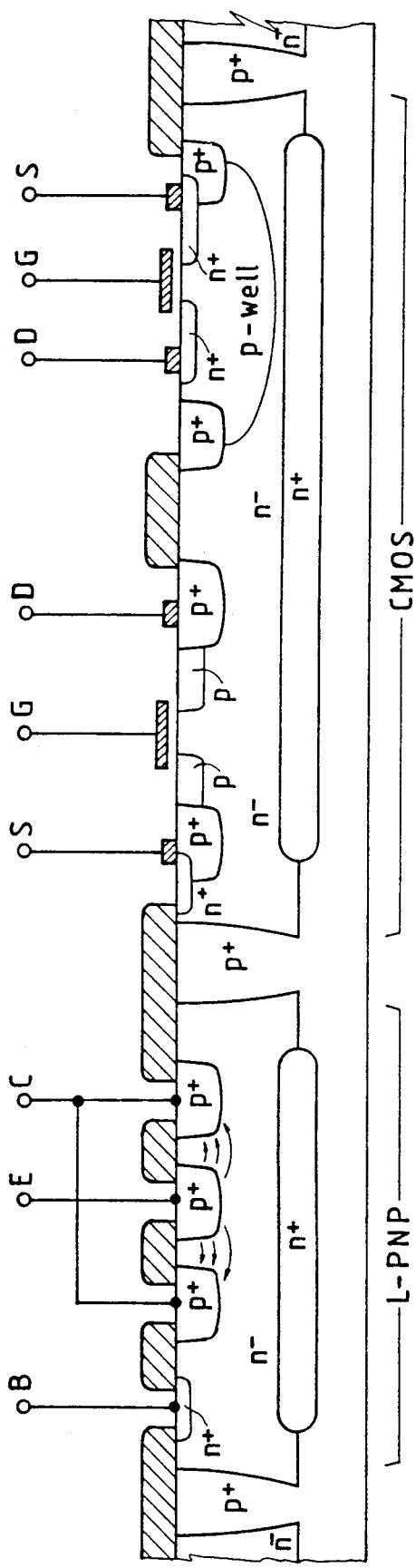
FIG. 1 shows a partial schematic cross section of a mixed technology integrated circuit made according to a first known technique.
Figure 2:
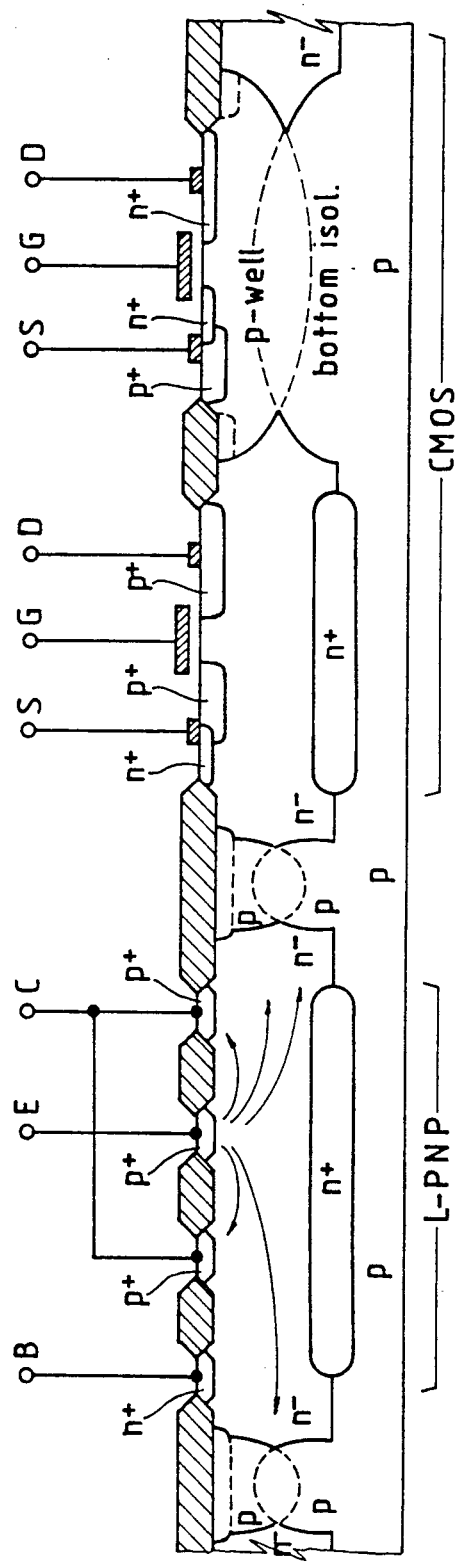
FIG. 2 is a partial schematic cross section of a high density, mixed technology integrated circuit made in accordance with a more recent known technique.

The previously discussed ratio Ic/Isubstrate which, or other structural parameters being the same, in the case of the PNP transistor of FIG. 2 was equal to about 8, surprisingly reaches about 300 in the case of the comparable PNP transistor made in accordance with the present invention and provided with the region 5C in the collector zone.

Moreover the presence of a lightly doped region such as the region 5C is (substantially a p-well region) in the collector region of the PNP transistor remarkably increases the Early voltage which may reach a value greater than 100 V. The $V_{CEO}$ voltage and the breakdown voltages BVCBO and BCES are also increased because said lightly doped collector region 5C, which could be called also a "collector extension region", sustains the greater part of the depletion when a reverse voltage is applied between the emitter and the collector of the transistor.

The fabrication process for making an integrated circuit in accordance with the present invention distinguishes itself from a standard fabrication process of these types of mixed-technology integrated devices by the fact that after having implanted the dopant in the top isolation areas, the dopant implantation for making the well regions is effected also on the collector areas of the relative lateral bipolar transistors in order that, following a subsequent diffusion heat treatment, collector extension regions (5C in FIG. 3) having the same diffusion profile of the well are formed. Of course il will be possible to preliminarly effect also on said collector areas an enrichment implantation as contemplated by a normal fabrication process for forming in a self-alignment mode enriched superficial regions (channel stopper) above the top isolation diffusions 5B and above the p-well diffusions 5A (indicated with 5D in FIG. 3).

After having realized the desired collector extension regions 5C simultaneously with the formation of the well regions and after having grown the isolation field oxide, the fabrication process may continue through a normal sequence of steps to the termination thereof.

As it will be evident to the skilled technician, what has been described in detail for the embodiment depicted in FIG. 3 is equally applicable in the case of an NPN lateral bipolar transistor in the context of an analog, mixed technology integrated circuit wherein all the polarities be inverted in respect to the polarities of the embodiment of FIG. 3.

Moreover the ranges of variation of the doping levels of the various regions of the silicon are also well known to the skilled technician. The indication: p-type silicon meaning substantially a silicon region moderately doped with boron while a p+ type region representing a region heavily doped with boron. Similarly the low conductivity epitaxial region is indicated as being an n⁻ silicon meaning a region very lightly doped with phosphorous, while n+ regions represent regions heavily doped with arsenic or phosphorous or antimony, in accordance with a jargon which is immediately comprehended by any skilled technician, notwithstanding the fact that the corresponding actual doping levels may vary within certain limits which are also well known and documented in specific, readily available literature.

What we claim is:

1. An integrated circuit, monolithically integrated in an epitaxial layer of lightly doped silicon of a first conductivity type grown on a monocrystalline, lightly doped silicon of a second conductivity type and comprising complementary, superficial field effect-transistors and bipolar lateral transistors f said second conductivity type, each bipolar lateral transistor of said second conductivity type being formed in a region of said epitaxial layer, electrically isolated from said substrate by a heavily doped layer of said first conductivity type formed at the bottom of said region and laterally by bottom isolation diffusions and top isolation or well diffusions merging to form walls of doped silicon of said second conductivity type extending through the entire thickness of said epitaxial layer around said region, each of said bipolar transistors comprising a heavily doped, base contact diffusion of said first conductivity type, a heavily doped emitter diffusion of said second conductivity type and heavily doped, annular collector diffusion of said second conductivity type formed around said emitter diffusion, said base contact, emitter and collector diffusions having respective profiles identical to respective diffusion profiles of source and drain regions of said complementary filed effect transistors, and characterized by comprising at least a second annular diffusion of said second conductivity type, having the same diffusion profile of said top isolation or well diffusion of said second conductivity type and extends beyond the profile of the latter, deeply within said epitaxial layer, for intercepting electric current originating from said emitter diffusion and for gathering the same to the transistor's collector subtracting it from dispersion toward said isolation diffusions surrounding the transistor region.

2. The integrated circuit according to claim 1, wherein said substrate is a p-type substrate, said epitaxial layer is an n− type layer, said bipolar lateral transistor is a PNP transistor and said second annular diffusion formed in the collector zone of the PNP transistor has the same diffusion profile of a p-well utilized in an n-channel field effect transistor.

3. The integrated circuit according to claim 2, wherein a superficial region of said second annular diffusion is boron enriched.

* * * * *